United States Patent [19]

Susi

[11] Patent Number: 4,520,418

[45] Date of Patent: May 28, 1985

[54] RESET CIRCUIT

[76] Inventor: Roger E. Susi, 7006 E. 89th Pl., Tulsa, Okla. 74133

[21] Appl. No.: 488,213

[22] Filed: Apr. 25, 1983

[51] Int. Cl.$^3$ ............................................. H02H 3/24
[52] U.S. Cl. ....................................... 361/92; 361/88; 361/90; 307/200 B; 307/200 A; 340/661
[58] Field of Search .................... 361/92, 88, 1, 90; 307/200 B, 200 A, 590; 340/661, 660, 663

[56] References Cited

U.S. PATENT DOCUMENTS

| | | | |
|---|---|---|---|
| 3,703,648 | 11/1972 | Wrabel | 361/92 X |
| 4,103,187 | 7/1978 | Imamura | 307/200 B X |
| 4,260,907 | 4/1981 | Winebarger | 307/200 A X |
| 4,433,390 | 2/1984 | Carp et al. | 307/200 A X |

*Primary Examiner*—Patrick R. Salce

*Attorney, Agent, or Firm*—Head, Johnson & Stevenson

[57] ABSTRACT

A reset circuit which monitors the voltage of the power supplied to a microprocessor unit, and produces a low resistance to ground at the reset terminal of the microprocessor whenever the supply voltage changes from a low value to a high value, or from a high value to a low value. It is based upon the combination of two RC circuits of different time constants, such that when the supply voltage is constant, no current flows in these circuits. A transistor is connected to the RC network such that it carries current only when there is a changing voltage of the power supply. If the voltage increases or decreases, a second transistor acting as an electronic switch grounds the reset terminal, and when the voltage becomes constant again, either at a high value or a low value, the switch opens and the reset voltage goes high.

4 Claims, 2 Drawing Figures

RESET CIRCUIT

BACKGROUND OF THE INVENTION

1. Field of the Invention

This invention lies in the field of electronic reset circuits. More particularly, it concerns a type of reset circuit which is fast acting, simple in construction and utilizes no power except when the voltage supply is changing, either upwardly or downwardly.

2. Description of the Prior Art

There is considerable prior art in the literature on reset circuits. However, the great majority of them have an amplifier or comparator which continuously monitors the voltage of the power supply and compares it against a standard voltage, and acts to close or open the reset circuit whenever there is a change of supply voltage. However, these reset circuits use continuous power for the circuit elements, even during the long periods of time when the voltage is constant.

SUMMARY OF THE INVENTION

It is a primary object of this invention to provide a reset circuit for monitoring the power supply voltage of a program controlled microprocessor.

It is a further object of this invention to provide a fast response switching circuit for applying or removing reset voltage from the reset terminal of a microprocessor and related circuits, so that while the voltage supply of the microprocessor is varying, the action of the microprocessor is stopped so that the integrity of the data in, and passing through, the microprocessor and its related circuits will be maintained. The reset circuit of this invention protects data under conditions of power-on, power-off, and during power transients.

These and other objects and advantages are realized and the limitations of the prior art are overcome by an electronic reset circuit which comprises a means for resetting to zero, through an electronic switch, which is actuated by a transistor, which is itself activated by a change in the power supply voltage. The rate of change of voltage or the amplitude of voltage change which will trigger the reset mechanism is adjustable by the proper selection of circuit components making up the reset circuit.

The power supply voltage of the reset circuit is tied to that of the microprocessor. A first RC series network is connected with the resistor at the supply potential and the capacitor to ground. A second capacitor is tied through a diode to the power supply while the second terminal of the second capacitor is tied to ground. The junction between the diode and second capacitor is tied through a second resistor to the junction between the first resistor and first capacitor.

A first transistor has its base connected to the junction between R1 and C1; its emitter is tied to the junction between diode and C2 and its collector tied through a third capacitor to ground. The second resistor is tied between the emitter and base of the first transistor. A second transistor (FET) has its gate tied to the junction between the collector and the third capacitor. A third resistor is connected across the third capacitor. In the second transistor the drain is connected to ground and the source is tied to the reset terminal of the microprocessor.

The device consists essentially of two RC networks of different time constants applied across the supply voltage to ground. The first transistor is connected to the second resistor between the base and the emitter. A voltage appears across this second resistor only while the first and second capacitors are charging or discharging. In other words, so long as the power supply voltage holds constant, there is no change in voltage of the capacitors and no charging current passes through the resistors and thus, the first transistor is maintained in an off position.

The second transistor is utilized as a fast acting switch with its source and drain tied between the reset terminal and ground. When the first transistor is on, a high voltage appears on the gate of the second transistor which essentially grounds the reset terminal and when the first transistor is turned off, this potential between the reset terminal and ground goes high, permitting the resetting of the microprocessor.

BRIEF DESCRIPTION OF THE DRAWINGS

These and other objects and advantages of this invention and a better understanding of the principles and details of the invention will be evident from the following description taken in conjunction with the appended drawings in which.

DESCRIPTION OF THE PREFERRED EMBODIMENT

Figure 1:
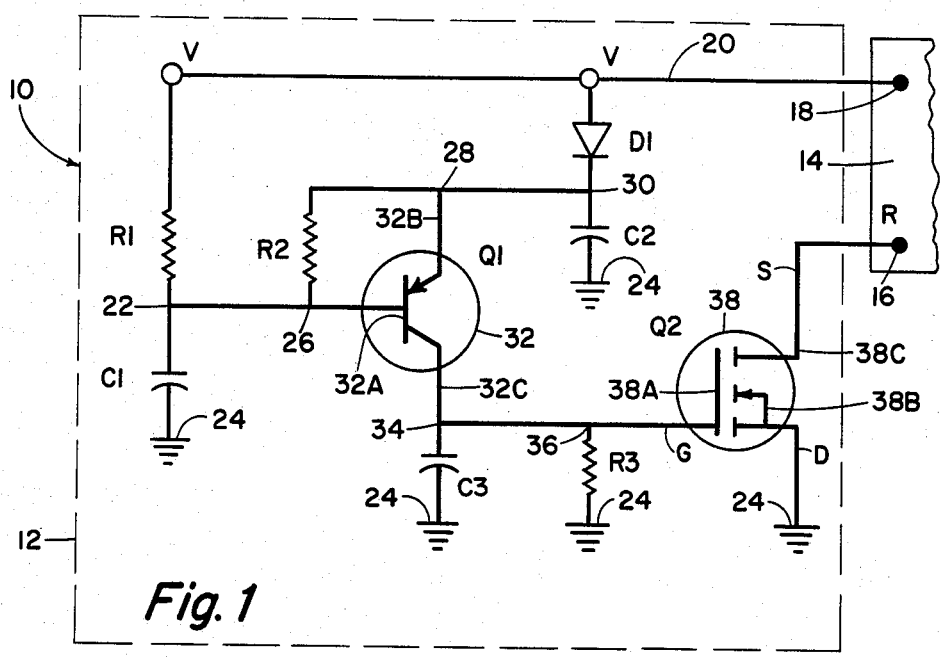
FIG. 1 is a schematic diagram of the electronic circuitry of this invention.

Referring now to the drawings and in particular to FIG. 1 there is shown one embodiment of an electronic circuit schematically that illustrates the operation of this invention. A dashed box 12 houses the system and circuitry of the reset apparatus indicated generally by the numeral 10. A second partial box 14 indicates schematically a portion of the circuits to be reset (i.e. microprocessor) and a first terminal 18 which is the power supply terminal, and a second terminal 16 which is the reset terminal. The power supply for the reset mechanism is provided by line 20 from the power supply terminal 18 of the circuits to be reset to the terminals V of the reset.

A first resistor R1 and first capacitor C1 are connected in series with the junction 22. The first end of the first resistor goes to the power supply voltage V. The second terminal of the first capacitor goes to ground 24. At a second terminal V a diode D1 and second capacitor C2 are connected in series to ground 24. The junction 30 between the diode and C2 goes to a second resistor R2 which is also connected to the junction 22. The second resistor R2 is effectively connected between the junction point 28 at one end of R2 which goes to the emitter 32B and the junction 26 at the base 32A of the transistor Q1 which connects to the junction 22. The collector 32C of the transistor Q1 connects to a junction 34 to capacitor C3 and to ground 24.

Referring to what has just been said, a first RC network R1 and C1 is tied between the supply voltage V and ground. A second capacitor C2 is tied through a diode to the supply voltage V with its junction going through resistance R2 to the junction 22. It will be clear that when the supply voltage V is constant, the capacitor C1 and C2 will be charged to the supply voltage V.

Thus, there will be no current flow in either R1 or R2. Since R2 connects the emitter and base of the transistor, if no potential is applied between those two terminals, then the transistor Q1 will remain in an off condition, and the charge stored in capacitor C3 will leak to ground through resistor R3, and eventually, the potential of gate 38A of the second transistor Q2 will go substantially to zero. Similarly, the drain 38B of transistor Q2 is connected to ground. Thus the source terminal 38C will go high (pulled up by circuits to be reset) and thus the reset terminal 16 will have a high voltage permitting the operation, or enabling the operation of the microprocessor.

Consider the case where the voltage V is low and the power switch is turned on. The voltage V rises from a low value to a high value V1. The capacitors C1 and C2 will begin to charge up and the difference in the rate of charge, or the rate of growth of potential on C1 and C2 will appear as a voltage across the resistor R2. The transistor Q1 will momentarily turn on, and will charge the capacitor C3, thus raising the voltage on the gate 38A of the second transistor Q2. As this gate voltage increases, the internal impedance between the source 38C and the drain 38B will drop to a low value essentially grounding the reset terminal 16.

This condition holds so long as the voltage is changing and when it changes to a high value and remains constant, then the same situation applies across the capacitors C1 and C2 where they become equal and no potential is supplied across the transistor Q1 and the gate potential of the transistor Q2, or the switch will dissipate via R3 and the source will again become high permitting operation of the microprocessor and so on.

The operation of the circuit elements and of the voltages at certain points in the circuit of FIG. 1 will now be described in terms of the six horizontal traces of FIG. 2. Certain basic time units T1, T2, T3, T4 are selected for convenience to be equal. However, the period of voltage on, from T1 to T3, can be as long or as short as desired and similarly, the time during which the voltage V is low, that is V0, can be as short or as long as desired.

Trace 50 illustrates a step-wise increase of potential of the power supply voltage V that lasts during the period T1 to T3 and then drops from V1 down to a low value V0. The capacitor C1 has a long time constant and as the voltage V increases, it begins to charge up according to trace 52 and at a time approximately T2 it becomes subtantially constant and remains constant 52A until time T3 when the supply voltage V drops to zero and capacitor C1 then begins to discharge through the first transistor Q1 and resistor R3.

As the voltage V rises at T1, capacitor C2 starts charging through the series diode D1 and charges more rapidly than does C1 to a constant value 54A until time T3 when again the voltage V drops to zero, C2 discharges through its resister R2 and R1 and through the transistor Q1 and R3 to ground.

The trace 56 illustrates the potential on capacitor C3. It will be clear that this capacitor C3 is charged to a potential while the transistor Q1 is turned on because otherwise that potential C3 will drain off through the resister R3 and the potential will go to zero as shown in trace 56. Similarly, when the transient change from high to low voltage at time T3 of trace 50 occurs, the transistor Q1 of trace 58 again turns on and stays on until the voltage of C1 again drops and Q1 again turns off.

Trace 60 represents the potential on the source 38C of Q2. It maintains a voltage relationship which is substantially opposite to that of the capacitor C3. That is, when Q1 is on, capacitor C3 is charging to a maximum potential and maintaining that potential and with that maximum potential, the impedance between the collector and the emitter 38C and 38B of transistor Q2 remain low shown as 60A and 60B.

Figure 2:
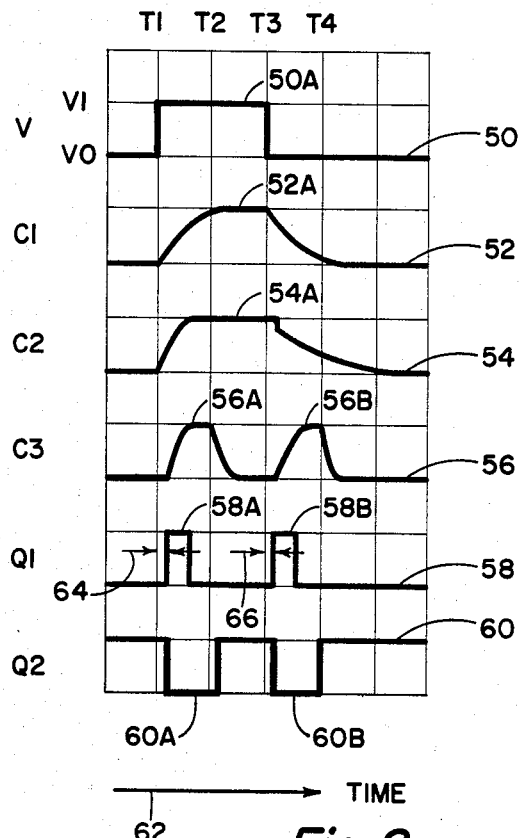
FIG. 2 shows a series of time records of voltages at various points in the electronic circuitry of FIG. 1, illustrating that the electronic switch is essentially open so long as the supply voltage is constant, either at a low value, or a high value.

In the traces of FIG. 2, time increases to the right as shown by the arrows 62. Small time delays, such as for example, those marked 64 and 66, will occur dependent upon the individual rate of rise of potential on C1, C2 and C3. Since these are a function of the resistance and capacitances R1, C1, R2, C2, and R3, C3, for example, suitable selection of the circuit element values can make these time delays as small as desired within limits, of course, since there must be reliability of the operation of the circuit of FIG. 1.

Another way of considering the circuit of FIG. 1 is that it represents a bridge circuit, having four legs. V is one junction of the bridge tied to two legs D1 and R1. The opposite potential junction to V is ground (GRD), which is tied to C1 and C2.

The two other junctions of the bridge are junctions 22 between R1 and C1, and 30 between D1 and C2. Resistor R2 is connected across the output of the bridge. When the bridge is in balance, that is when V is constant and voltages across C1 and C2 are equal, no current flows in R2.

Transistor Q1 can be considered a switch responsive to the voltage across R2. Thus when the bridge is in balance there is zero voltage across R2 and the transistor Q1 is off.

When the voltage V changes, the voltage at each end of R2 changes at different rates and Q1 turns on and C3 charges and the switch Q2 operates.

Note that R1 and C1 form a simple RC time constant that charges/discharges at approximately the same rate whether V is going V0 to V1 or V1 to V0. C2 and the emitter of Q1 32B charges rapidly through D1 when V changes from V0 to V1 but discharges slowly through the combination of R2 and R1 unless Q1 turns on. Therefore C2 takes on a charge holding Q1's emitter up until C1 charges or discharges sufficiently to cause enough potential difference across R2 to turn Q1 on. When Q1 turns on charge will rapidly transfer from C2 to C3.

Once a potential sufficient to turn Q2 on has been reached at 34, Q1 may shut off. Charge can only be removed from C3 and the gate of Q2 via R3 since the gate of Q2 has a very high impedance and Q1's reverse leakage current is low. Therefore the width of the reset pulse (60) can be made as short or as long as desired by the RC time constant of R3 and C3. Also where V has fallen to a potential such that Q1 and its associated circuits may not work properly, Q2 will continue to generate a stable low true reset signal per the R3 C3 time constant.

While the invention has been described with a certain degree of particularity, it is manifest that many changes may be made in the details of construction and the arrangement of components without departing from the spirit and scope of this disclosure. It is understood that the invention is not limited to the exemplified embodiments set forth herein but is to be limited only by the scope of the attached claim or claims, including the full range of equivalency to which each element thereof is entitled.

What is claimed:

1. A reset circuit for monitoring the power supply voltage of a microprocessor, and for disabling the action of said microprocessor for a selected time period, at the times of power supply voltage change, such as at times of power on and power off of the microprocessor, comprising:
   (a) a bridge network having four terminals, a first terminal A, a second terminal B, a third terminal C and a fourth terminal D, a first arm comprising a first diode D1 connected from terminal A to terminal B, a second arm comprising a first capacitor C2 connected from terminal B to terminal C, a third arm comprising a second capacitor C1 connected from terminal C to terminal D, and a fourth arm comprising a first resistor connected from terminal A to terminal D;
   (b) a power supply with voltage terminal V connected to terminal A and a ground terminal connected to terminal C;
   (c) the output terminals of said bridge are terminals B and D, with a load resistance R2 connected between them;
   (d) amplifier means connected across the output terminals B and D, said amplifier means having no direct connection to said power supply and receiving operating power only from said bridge when said bridge is unbalanced;
   (e) a reset terminal; and
   (f) an electronic switch means controlled by said amplifier means and being connected to said reset terminal, the switch means supplying a high voltage which serves as a reset voltage, when said amplifier means is turned off.

2. The reset circuit as in claim 1 in which said amplifier means comprises first transistor means Q1 with its emitter connected to terminal B and its base to terminal D and its collector connected to ground through a resistor R3 and a capacitor C3 in parallel, and to electronic switch means connected between said reset terminal and ground.

3. The reset circuit as in claim 1 in which the voltage to be sensed for reset purposes is also the voltage that operates the reset circuit.

4. The reset circuit as in claim 2 in which said electronic switch means comprises a second transistor Q2 the gate of which is connected to the collector of Q1, its drain connected to ground, and its source connected to said reset terminal.

* * * * *